(12) United States Patent
Kim et al.

(10) Patent No.: US 8,975,132 B2
(45) Date of Patent: Mar. 10, 2015

(54) SEMICONDUCTOR DEVICE WITH ISOLATION LAYER, ELECTRONIC DEVICE HAVING THE SAME, AND METHOD FOR FABRICATING THE SAME

(71) Applicant: SK Hynix Inc., Gyeonggi-do (KR)

(72) Inventors: Hyung-Hwan Kim, Gyeonggi-do (KR);
Bong-Ho Choi, Gyeonggi-do (KR);
Jin-Yul Lee, Gyeonggi-do (KR);
Seung-Seok Pyo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/308,323

(22) Filed: Jun. 18, 2014

(65) Prior Publication Data

US 2014/0302663 A1    Oct. 9, 2014

Related U.S. Application Data

(62) Division of application No. 13/544,411, filed on Jul. 9, 2012, now Pat. No. 8,786,047.

(30) Foreign Application Priority Data

Mar. 26, 2012    (KR) ................. 10-2012-0030529

(51) Int. Cl.
*H01L 21/8238*    (2006.01)
*H01L 21/762*    (2006.01)
*H01L 27/108*    (2006.01)

(52) U.S. Cl.
CPC .... *H01L 21/76224* (2013.01); *H01L 27/10894* (2013.01); *H01L 21/76229* (2013.01); *H01L 21/762* (2013.01)
USPC ........... 438/218; 438/207; 438/219; 438/294; 257/E21.546; 257/E27.01

(58) Field of Classification Search
CPC ............ H01L 21/762; H01L 21/76224; H01L 21/76229; H01L 27/10894
USPC .......... 438/207, 218, 219, 294; 257/E21.546, 257/E27.01
See application file for complete search history.

(56) References Cited

U.S. PATENT DOCUMENTS

2005/0167778 A1*    8/2005    Kim et al. ...................... 257/510
2009/0068816 A1*    3/2009    Eun .............................. 438/425

* cited by examiner

*Primary Examiner* — Long K Tran
(74) *Attorney, Agent, or Firm* — IP & T Group LLP

(57) ABSTRACT

A semiconductor device with an isolation layer buried in a trench includes an interface layer formed on the surface of the trench, a buffer layer formed in the interface layer at a bottom corner of the trench, a liner layer formed over the interface layer, and a gap-fill layer gap-filling the trench over the liner layer. The trench includes a micro-trench formed at the bottom corner thereof, and the buffer layer fills the micro-trench.

8 Claims, 10 Drawing Sheets

SEMICONDUCTOR DEVICE WITH ISOLATION LAYER, ELECTRONIC DEVICE HAVING THE SAME, AND METHOD FOR FABRICATING THE SAME

CROSS-REFERENCE TO RELATED APPLICATIONS

This application is a division of U.S. patent application Ser. No. 13/544,411 filed on Jul. 9, 2012, which claims priority of Korean Patent Application No. 10-2012-0030529, filed on Mar. 26, 2012. The disclosure of each of the foregoing application which is incorporated herein by reference in its entirety.

BACKGROUND

1. Field

Exemplary embodiments of the present invention relate to a semiconductor device fabrication technology, and more particularly, to a semiconductor device with an isolation layer buried in a trench, an electronic device having the same, and a method for fabricating the same.

2. Description of the Related Art

A semiconductor device includes an isolation layer to isolate adjacent unit components from each other, and the isolation layer is formed through a shallow trench isolation (STI) process. The key steps of the STI process involve forming a trench in a substrate and burying a dielectric material in the trench to form an isolation layer. The STI process may be applied to a process for fabricating a very large scale integrated semiconductor device, for example, one or more gigabyte DRAM.

FIGS. 1A to 1C are cross-sectional views illustrating a conventional method for fabricating an isolation layer of a semiconductor device.

Referring to FIG. 1A, a mask pattern (not illustrated) is formed over a substrate 11 having a first region and a second region, and trenches are formed by etching the substrate 11 using the mask pattern as an etch barrier. At this time, the trenches include a first trench 12A formed in the first region and a second trench 12B formed in the second area, and a first critical dimension CD1 of the first trench 12A is smaller than a second critical dimension CD2 of the second trench 12B due to a difference between the densities of unit components (for example, transistors) formed in the first and second regions.

Referring to FIG. 1B, an interface layer 13 and a liner layer 14 are sequentially formed on the surface of the first and second trenches 12A and 12B.

Referring to FIG. 1C, a gap-fill layer 15 is formed on the liner layer 14 so as to fill the first and second trenches 12A and 12B, and a planarization process is performed until the surface of the substrate 11 is exposed, thereby completing an isolation layer 100.

In the conventional method, the interface layer 13 is formed on the surface of the second trench 12B in the second region at the same time as the interface layer 13 is formed on the surface of the first trench 12A in the first region. Therefore, the thickness of the interface layer 13 in the first region is equal to that of the interface layer 13 in the second region.

Meanwhile, with the increase in integration degree of the semiconductor device, the first critical dimension CD1 of the first trench 12A is reduced to thereby decrease a process margin in forming the liner layer 14 and the gap-fill layer 15 in the first trench 12A.

In order to secure such a margin, a method of reducing the thickness of the interface layer 13 has been proposed in the first region. However, since the interface layer 13 is formed in the first and second regions at the same time, thickness of the interface layer 13 is reduced in the second region as well, thereby degrading hot electron induced punchthrough (HEIP) effect in the second region.

SUMMARY

Exemplary embodiments of the present invention are directed to a semiconductor device with an isolation layer, which is capable of securing an isolation layer formation process margin in a region where the density of unit components is relatively high while preventing degradation of HEIP effect in a region where the density of unit components is relatively low, an electronic device having the same, and a method for fabricating the same.

In accordance with an exemplary embodiment of the present invention, a semiconductor device with an isolation layer buried in a trench includes an interface layer formed on the surface of the trench, a buffer layer formed in the interface layer at a bottom corner of the trench, a liner layer formed over the interface layer, and a gap-fill layer gap-filling the trench over the liner layer.

In accordance with another exemplary embodiment of the present invention, a semiconductor device includes a first interface layer formed the surface of a first trench, a first gap-fill layer gap-filling the first trench over the first interface layer, a second interface layer formed over the surface of a second trench of a substrate, a buffer layer formed in the second interface layer at a bottom corner of the second trench, a liner layer formed over the second interface layer, and a second gap-fill layer gap-filling the second trench over the liner layer.

In accordance with yet another exemplary embodiment of the present invention, a semiconductor device with an isolation layer buried in a trench includes a first intermediate interface layer formed on the surface of the trench, a buffer layer formed on the first intermediate interface layer at a bottom corner of the trench, a second intermediate interface layer formed on the first intermediate interface layer and the buffer layer, a liner layer formed over the second intermediate interface layer, and a gap-fill layer gap-filling the trench over the liner layer.

In accordance with still another exemplary embodiment of the present invention, a method for fabricating a semiconductor device includes forming a trench in a substrate, forming a first insulation layer on the surface of the trench, forming a buffer layer over the first insulation layer at a bottom corner of the trench, forming a third insulation layer along the surface of the resultant structure including the buffer layer, forming a liner layer over the third insulation layer, and forming a gap-fill layer to gap-fill the trench over the liner layer. The trench may include a micro-trench formed at the bottom corner thereof, and the buffer layer may fill the micro-trench.

In accordance with still another exemplary embodiment of the present invention, a method for fabricating a semiconductor device includes forming a first trench and a second trench in a substrate, the second trench having a critical dimension (CD) greater than the first trench, forming a first insulation layer on the surface of the substrate including the first and second trenches, forming a second insulation layer on the surface of the substrate including the first insulation layer, the second insulation layer gap-filling the first trench and formed along the surface of the second trench, selectively etching the second insulation layer to form a first gap-fill layer gap-filling the first trench and a buffer layer at a bottom corner of the second trench; sequentially forming a third insulation layer and a liner layer on the surface of the substrate including the buffer layer, and forming a second gap-fill layer to gap-fill the second trench over the liner layer. The second trench may include a micro-trench formed at the bottom corner thereof, and the buffer layer may fill the micro-trench.

In accordance with still another exemplary embodiment of the present invention, an electronic device includes an isolation layer including a trench formed in a substrate, an interface layer formed on the surface of the trench, a buffer layer formed in the interface layer at a bottom corner of the trench, a liner layer formed over the interface layer, and a gap-fill layer gap-filling the trench over the liner layer and unit components isolated by the isolation layer.

In accordance with still another exemplary embodiment of the present invention, an electronic device includes a first isolation layer including a first interface layer formed on the surface of a first trench and a first gap-fill layer formed on the first interface layer and gap-filling the first trench, a second isolation layer including a second interface layer formed on the surface of a second trench, a buffer layer formed in the second interface layer at a bottom corner of the second trench, a liner layer formed on the second interface layer, and a second gap-fill layer gap-filling the second trench over the liner layer, and unit components isolated by the first and second isolations, wherein the second trench has a CD greater than the first trench.

DETAILED DESCRIPTION

Figure 1A:
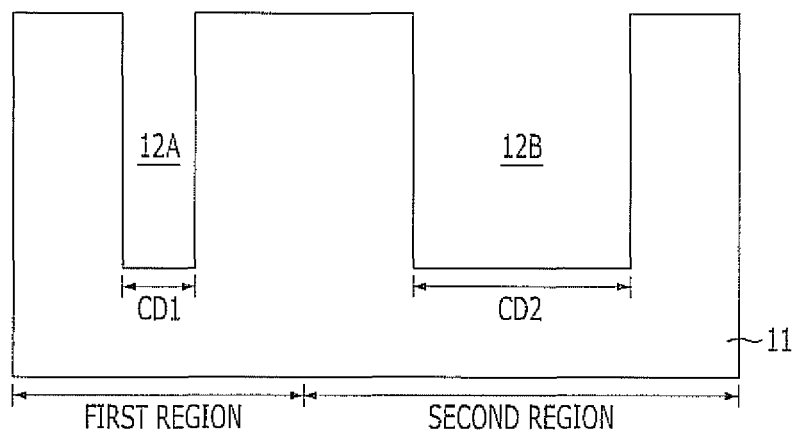
FIGS. 1A to 1C are cross-sectional views illustrating a conventional method for fabricating an isolation layer of a semiconductor device.
Figure 1B:
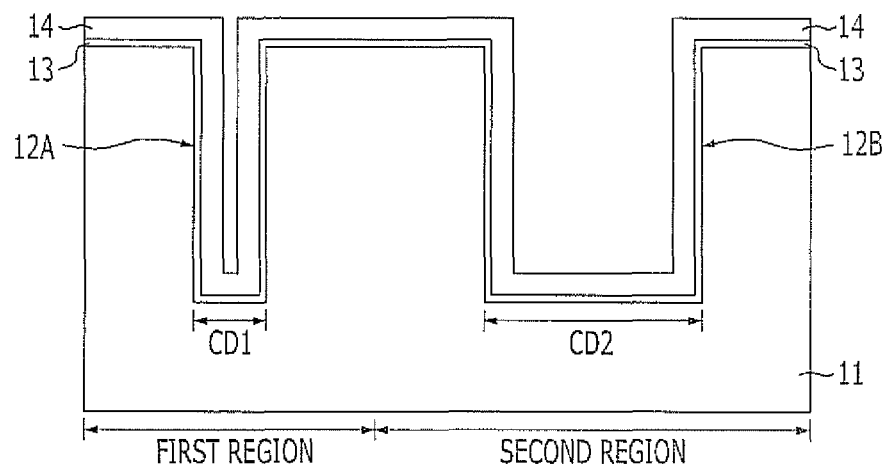
Figure 1C:
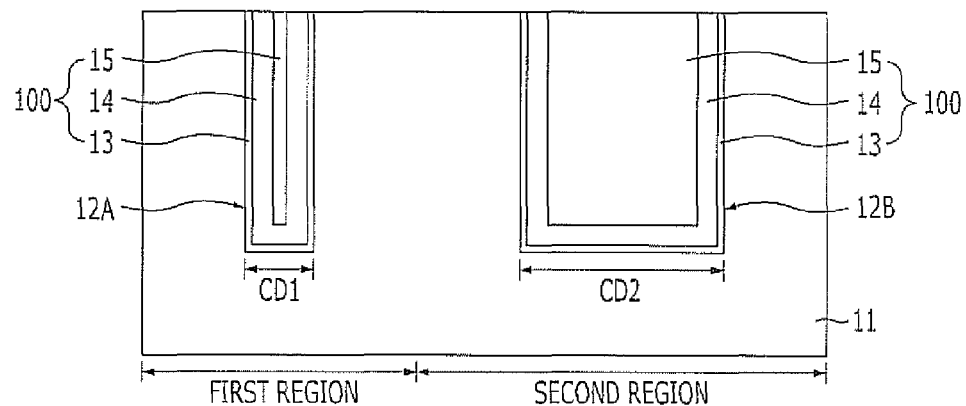

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the exemplary embodiments of the present invention, in order to provide a semiconductor device with an isolation layer, capable of securing an isolation layer formation process margin in a region where the density of unit components is relatively high and simultaneously preventing the degradation of HEIP effect in a region where the density of unit components is relatively low and a method for fabricating the same, an interface layer of the isolation layer is formed to a different thickness in each region. Here, the unit components may include transistors, the region where the density of unit components is relatively high may include a cell region, and the region where the density of unit components is relatively low may include a peripheral circuit region in a semiconductor memory device such as DRAM.

Figure 2A:
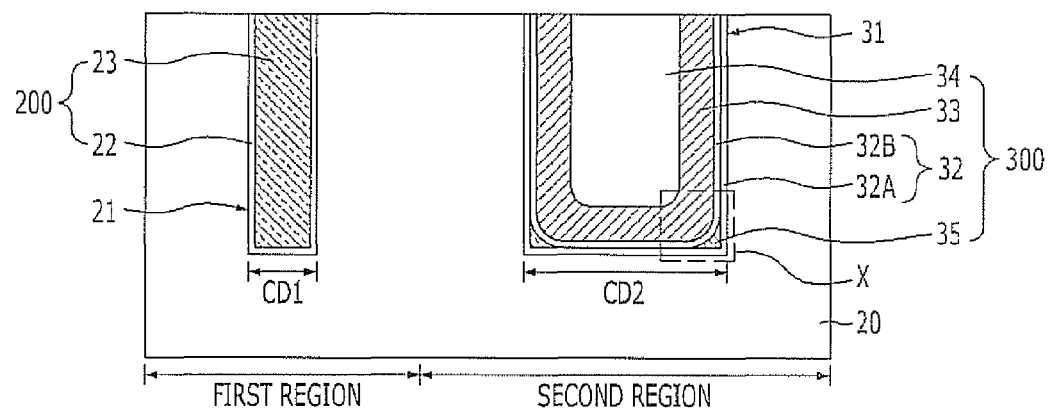
FIGS. 2A to 2C illustrate a semiconductor device with an isolation layer buried in a trench in accordance with an exemplary embodiment of the present invention.
Figure 2B:
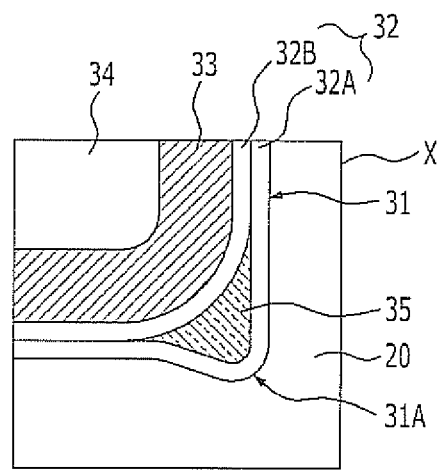
Figure 2C:
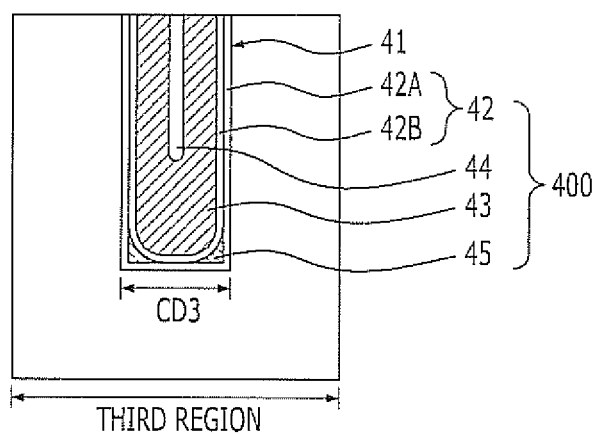
Figure 3A:
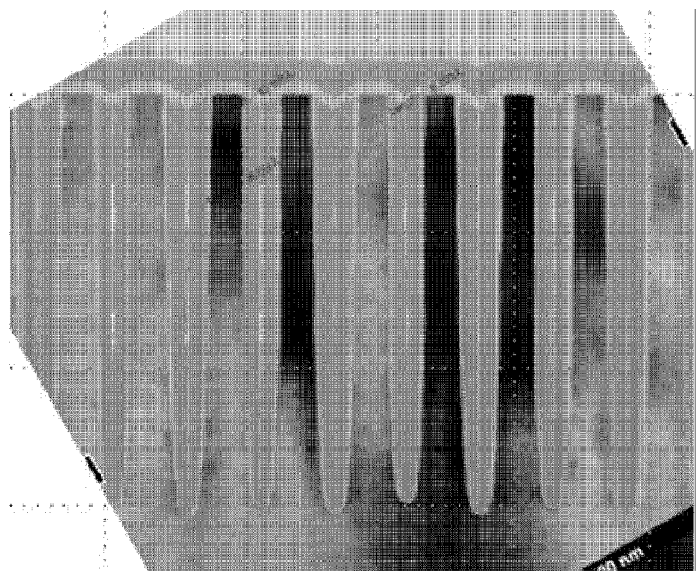
FIGS. 3A and 3B are images showing isolation layers which are formed in accordance with the exemplary embodiment of the present invention.
Figure 3B:
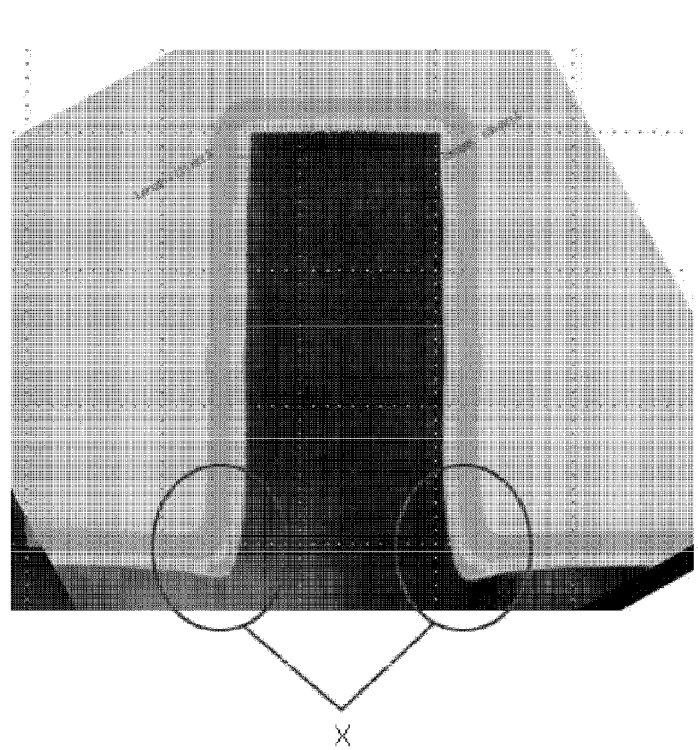

FIGS. 2A to 2C illustrate a semiconductor device with an isolation layer buried in a trench in accordance with an embodiment of the present invention. FIGS. 2A and 2C are cross-sectional views, and FIG. 2B is an expanded diagram of a portion represented by 'X' in FIG. 2A. Furthermore, FIGS. 3A and 3B are images showing isolation layers which are formed in accordance with the embodiment of the present invention. FIG. 3A is an image showing a first isolation layer formed in a first region, and FIG. 3B is an image showing a second isolation layer formed in a second region. For reference, 'X' in FIG. 3B indicates the same area as 'X' in FIG. 2A.

Referring to FIGS. 2A, 2B, 3A, and 3B, the semiconductor device in accordance with the embodiment of the present invention may include a first isolation layer 200 buried in a first trench 21 of the first region and a second isolation layer 300 buried in a second trench 31 of the second region. The first and second trenches 21 and 31 may have the same depth. For example, the first and second trenches 21 and 31 have a depth of 1,500 Å to 5,000 Å based on the surface of the substrate 20.

Here, when the semiconductor device in accordance with the embodiment of the present invention is a semiconductor memory device such as DRAM, the first region may include a cell region, and the second region may include a peripheral circuit region. Therefore, due to a difference in density of unit components formed in the cell region and the peripheral circuit region, a first critical dimension CD1 of the first trench 21 may be smaller than a second critical dimension CD2 of the second trench 31 (CD1<CD2). While the drawings illustrate that only one isolation structure is formed in each region, for description purposes, a plurality of trenches for isolation may be formed in each region. A distance between the first trenches 21 may be set smaller than a distance between the second trenches 31 as well. That is, the density of the first trenches 21 may be greater than that of the second trenches 31 per the same area.

The first isolation layer 200 may include a first interface layer 22 formed on the surface of the first trench 21 and a first gap-fill layer 23 filling the first trench 21 over the first interface layer 22. The first interface layer 22 and the first gap-fill layer 23 may include any one selected from the group consisting of oxide, nitride, and oxynitride. The first isolation layer 200 has a simple structure consisting of the first interface layer 22 and the first gap-fill layer 23. Therefore, although the first critical dimension CD1 of the first trench 21 is reduced with the increase in integration degree of the semiconductor device, a process margin may be secured in forming the first gap-fill layer 23.

The first interface layer 22 serves to restore the surface of the first trench 21, damaged during the formation of the first trench 21, and improve an interfacial characteristic between the first gap-fill layer 23 and the substrate 20. The first interface layer 22 may include oxide formed by thermal oxidation or chemical vapor deposition (CVD). At this time, the first interface layer 22 may include oxide formed by thermal oxidation, in order to more effectively restore the surface of the first trench 21. Furthermore, the first interface layer 22 may have such a thickness as to provide a process margin during the formation process of the first gap-fill layer 23. For example, the first interface layer 22 may have a thickness of 80 Å or less, i.e., a thickness of 1 Å to 80 Å.

The first trenches 21 formed in the first region have a smaller CD (or aspect ratio) and distance therebetween than the second trenches 31 formed in the second region. Therefore, the first gap-fill layer 23 may include nitride, in order to relieve stress caused by the shape and arrangement of the first trenches 21.

The second isolation layer 300 may include a second interface layer 32 formed on the surface of the second trench 31, a first buffer layer 35 formed in the second interface layer 32 at a bottom corner of the second trench 31, a first liner layer 33 formed on the second interface layer 32, and a second gap-fill layer 34 filling the second trench 31 over the first liner layer 33. The second interface layer 32, the first buffer layer 35, the first liner layer 33, and the second gap-fill layer 34 may include any one selected from the group consisting of oxide, nitride, and oxynitride.

The second interface layer 32 may include a stacked layer of a first intermediate interface layer 32A formed on the surface of the second trench 31 and a second intermediate interface layer 32B formed on the first intermediate interface layer 32A. At this time, the first intermediate interface layer 32A serves to restore the surface of the second trench 31, damaged during the formation process of the second trench 31. The second intermediate interface layer 32B serves to improve an interface characteristic between the first liner layer 33 and the substrate 20, and form the second interface layer 32 having such a thickness as to prevent the degradation of HEIP effect.

The first and second intermediate interface layers 32A and 32B may include oxide formed by thermal oxidation or CVD. At this time, the first intermediate interface layer 32A may include oxide formed by thermal oxidation, in order to effectively restore the surface of the second trench 31. The first intermediate interface layer 32A may have a thickness of 80 Å or less, for example, a thickness of 1 Å to 80 Å. The second intermediate interface layer 32B may include oxide formed by CVD, in order to prevent the area of an active region defined by the second isolation layer 300 from being reduced by the second intermediate interface layer 32B, and more easily provide such the thickness of the second interface layer 32, which is capable of preventing the degradation of HEIP effect. The second intermediate interface layer 32B may be thicker than the first intermediate interface layer 32A and may have a thickness of 30 Å to 500 Å.

The first buffer layer 35 formed at the bottom corner of the second trench 31 serves to relieve electric field concentration caused by the sharp shape of the bottom corner of the second trench 31, and it may be inserted between the first and second intermediate interface layers 32A and 32B of the second interface layer 32. Such a structure may prevent the damage and loss of the surface of the second trench 31 during the formation process of the first buffer layer 35. For this structure, the first buffer layer 35 may include a material layer having selectivity with the second interface layer 32. For example, when the first intermediate interface layer 32A is formed of oxide, the first buffer layer 35 may be formed of nitride.

Furthermore, the first buffer layer 35 has a shape to fill a micro-trench 31A formed at the bottom corner of the second trench 31. For reference, the first and second trenches 21 and 31 having different CDs are formed at the same, in order to simplify the process. Due to an etch rate difference and scattering caused by the CD difference therebetween, the micro-trench 31A is formed at the bottom corner of the second trench 31. At this time, since the first buffer layer 35 has a shape to fill the micro-trench 31a formed at the bottom corner of the second trench 31, the second interface layer 32, the first liner layer 33, and the second gap-fill layer 34 may be prevented from being defective due to the micro-trench 31A. Furthermore, the deposition characteristic of the first liner layer 33 and the gap-fill characteristic of the second gap-fill layer 34 may be improved. For reference, in the conventional method, the interface layer is not formed to have a constant thickness at the micro-trench due to the sharp shape of the micro-trench formed at the bottom of the trench. Accordingly, electrical field concentration at the bottom corner of the trench becomes high, and the deposition characteristic of the liner layer and the gap-fill characteristic of the gap-fill layer are degraded to cause a defect such as a void.

The second gap-fill layer 34 may include a spin-on dielectric formed by a spin coating method, in order to secure a gap-fill characteristic in gap-filling the second trench 31 having a CD greater than the first trench 21. For example, the second gap-fill layer 34 may include a spin-on dielectric based on polysilazane. In this is embodiment of the present invention, the second gap-fill layer 34 consisting of a single layer is described as an example. However, the second gap-fill layer 34 may include a stacked structure of a plurality of dielectric materials, for example, a stacked layer of a spin-on dielectric based on polysilazane and high density plasma (HDP) oxide.

The first liner layer 33 serves to relieve stress caused by the second gap-fill layer 34 and simultaneously prevent impurities contained in the second gap-fill layer 34 from diffusing into the substrate 20. For this operation, the first liner layer 33 may include nitride and may have a thickness of 50 Å to 2,000 Å depending on the stress caused by the second gap-fill layer 34. For reference, the second gap-fill layer 34, for example, the spin-on dielectric may be subjected to an annealing process to improve a film quality. During the annealing process, the volume change (that is, stress change) of the spin-on dielectric may occur. The stress change of the second gap-fill layer 34 may be relieved by the first liner layer 33.

The second isolation layer 300 having the above-described structure may easily provide such the thickness of the second interface layer 32 to the semiconductor device, because the second interface layer 32 has a stacked structure of the first intermediate interface layer 32A and the second intermediate interface layer 32B. Therefore, the degradation of HEIP effect may be prevented.

Furthermore, since the second isolation layer 300 includes the first buffer layer 35 formed at the bottom corner of the second trench 31, electrical field concentration may be relieved and simultaneously characteristic degradation may be prevented from being caused by the micro-trench 31A.

Referring to FIG. 2C, the semiconductor device in accordance with the embodiment of the present invention may further include a third isolation layer 400 buried in a third trench 41 of a third region. The third trench 41 may have the same depth as the first and second trenches 21 and 31, for example, a thickness of 1,500 Å to 5,000 Å based on the surface of the substrate 20. Here, when the semiconductor device in accordance with the embodiment of the present invention is a semiconductor memory device such as DRAM, the third region may include a peripheral circuit region where the density of trenches is greater than in the second region. Therefore, a third critical dimension CD3 of the third trench 41 may be greater than the first critical dimension CD1 of the first trench 21, and smaller than the second critical dimension CD2 of the second trench 31 (CD1<CD3<CD2).

The third isolation layer 400 may include a third interface layer 42 formed on the surface of the third trench 41, a second buffer layer 45 formed in the third interface layer 42 at a bottom corner of the third trench 41, a second liner layer 43 formed on the third interface layer 42 so as to fill the lower part of the third trench 41 and formed on sidewalls of the upper part of the third trench 41, and a third gap-fill layer 44 filling the trench 44 over the second liner layer 43. The third interface layer 42, the second buffer layer 45, the second liner layer 43, and the third gap-fill layer 44 may include any one selected from the group consisting of oxide, nitride, and oxynitride.

The third interface layer 42 may include a stacked layer of a third intermediate interface layer 42A formed on the surface of the third trench 41 and a fourth intermediate interface layer 42B formed on the third intermediate interface layer 42A. At this time, the third intermediate interface layer 42A serves to restore the surface of the third trench 41, damaged during the formation process of the third trench 41. The fourth intermediate interface layer 42B serves to improve an interface characteristic between the second liner layer 43 and the substrate 20 and form the third interface layer 42 having such a thickness as to prevent the degradation of HEIP effect.

The third intermediate interface layer 42A and the fourth intermediate interface layer 42B may include oxide formed by thermal oxidation or CVD. At this time, the third intermediate interface layer 42A may include oxide formed by thermal oxidation, in order to more effectively restore the surface of the third trench 41. The third intermediate interface layer 42A may have a thickness of 80 Å or less, for example, a thickness of 1 Å to 80 Å. The fourth intermediate interface layer 42B may include oxide formed by CVD, in order to prevent the area of an active region defined by the third isolation layer 400 from being reduced by the fourth intermediate interface layer 42B, and more easily provide such the thickness of the third interface layer 42, which is capable of preventing the degradation of HEIP effect. The fourth intermediate interface layer 42B may be thicker than the third intermediate interface layer 42A and may have a thickness of 30 Å to 500 Å.

The second buffer layer 45 formed at the bottom corner of the third trench 41 serves to relieve electric field concentration caused by the sharp shape of the bottom corner of the third trench 41, and sit may be inserted between the third and fourth intermediate interface layers 42A and 42B of the third interface layer 42. Such a structure may prevent the surface damage and loss of the third trench 41 during the formation process of the second buffer layer 45. For this structure, the second buffer layer 45 may include a material layer having selectivity with the third interface layer 42. For example, when the third intermediate interface layer 42A is formed of oxide, the second buffer layer 45 may be formed of nitride.

Furthermore, the second buffer layer 45 has a shape to fill a micro-trench formed at the bottom corner of the third trench 41. For reference, the first to third trenches 21 to 41 having different CDs are formed at the same, in order to simplify the process. Due to an etch rate difference and scattering caused by the CD difference therebetween, a micro-trench may also be formed at the bottom corner of the third trench 41, as in the second trench 31. At this time, since the second buffer layer 45 has a shape to fill the micro-trench formed at the bottom corner of the third trench 41, the third interface layer 42, the second liner layer 43, and the third gap-fill layer 44 may be prevented from being defective due to the micro-trench. Furthermore, it the deposition characteristic of the second liner layer 43 and the gap-fill characteristic of the third gap-fill layer 44 may be improved.

The third gap-fill layer 44 may include a spin-on dielectric formed by a spin coating method, in order to secure a gap-fill characteristic in gap-filling the third trench 41 having a CD greater than the first trench 21. For example, the third gap-fill layer 44 may include a spin-on dielectric based on polysilazane. In this embodiment of the present invention, the third gap-fill layer 44 consisting of a single layer is described as an example. However, the third gap-fill layer 44 may include a stacked layer of a plurality of dielectric materials, for example, a stacked layer of spin-on dielectric based on polysilazane and HDP oxide.

The second liner layer 43 filling the lower part of the third trench 41 and formed on the sidewalls of the upper part of the third trench 41 serves to relieve stress caused by the third gap-fill layer 44 and simultaneously prevent impurities contained in the third gap-fill layer 44 from diffusing into the substrate 20. For this structure, the second liner layer 43 may include nitride and may have a thickness of 50 Å to 2,000 Å depending on the stress caused by the third gap-fill layer 44.

The third isolation layer 400 having the above-described structure may easily provide such the thickness of the third interface layer 42 to the semiconductor device, because the third interface layer 42 has a stacked structure of the third intermediate interface layer 42A and the fourth intermediate interface layer 42B. Therefore, the degradation of HEIP effect may be prevented.

Furthermore, since the third isolation layer 400 includes the second buffer layer 45 formed at the bottom corner of the third trench 41, electrical field concentration may be relieved and simultaneously characteristic degradation may be prevented from being caused by the micro-trench.

FIGS. 4A to 4G are cross-sectional views illustrating a method for fabricating a semiconductor device with an isolation layer buried in a trench in accordance with another embodiment of the present invention. Hereinafter, a method for fabricating the semiconductor device having the structure illustrated in FIGS. 2A to 2C will be described as an example.

Figure 4A:
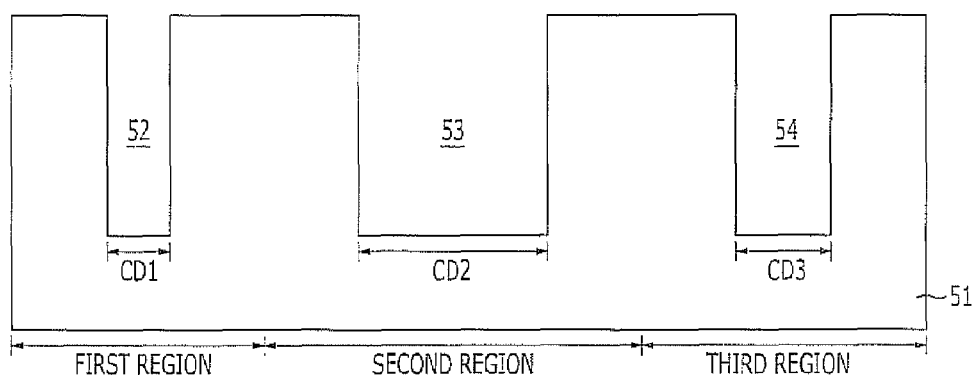
FIGS. 4A to 4G are cross-sectional views illustrating a method for fabricating a semiconductor device with an isolation layer buried in a trench in accordance with another exemplary embodiment of the present invention.

Referring to FIG. 4A, a mask pattern (not illustrated) is formed over a substrate 51 having first to third regions. Here, when the semiconductor device in accordance with the embodiment of the present invention is a semiconductor memory device such as DRAM, the first region may include a cell region, and the second and third regions may include a peripheral circuit region. At this time, the density of unit components in the third region may be greater than in the second region.

Using the mask pattern as an etch barrier, the substrate 51 is etched to form trenches for isolation in the respective regions. At this time, the trenches may include a first trench 52 formed in the first region, a second trench 53 formed in the second region, and a third trench 54 formed in the third region. The first to third trenches 52, 53, and 54 have different CDs due to a difference among the densities of unit components formed in the respective regions. Specifically, the first trench 52 may have the smallest CD, and the second trench 53 may be the largest CD (CD1<CD3<CD2). FIG. 4A illustrates that one trench is formed in each region, for description purposes. However, a plurality of trenches may be formed in each region. According to the densities of unit components in the respective regions, a distance between the first trenches 52 may be the smallest, and a distance between the second trenches 53 may be the largest.

The first to third trenches 52 to 54 may be formed at the same time, in order to simplify the process. Therefore, the first to third trenches may have the same depth based on the surface of the substrate 51. For example, the first to third trenches 52 to 54 may be formed to have a depth of 1,500 Å to 5,000 Å.

Here, although not illustrated in the drawing, micro-trenches (refer to FIGS. 2B and 3B) may be formed at bottom corners of the second and third trenches 53 and 54 due to an effect of scattering and an etch rate difference based on a CD difference, as the first to third trenches 52 to 54 having different CDs are formed at the same time.

Figure 4B:
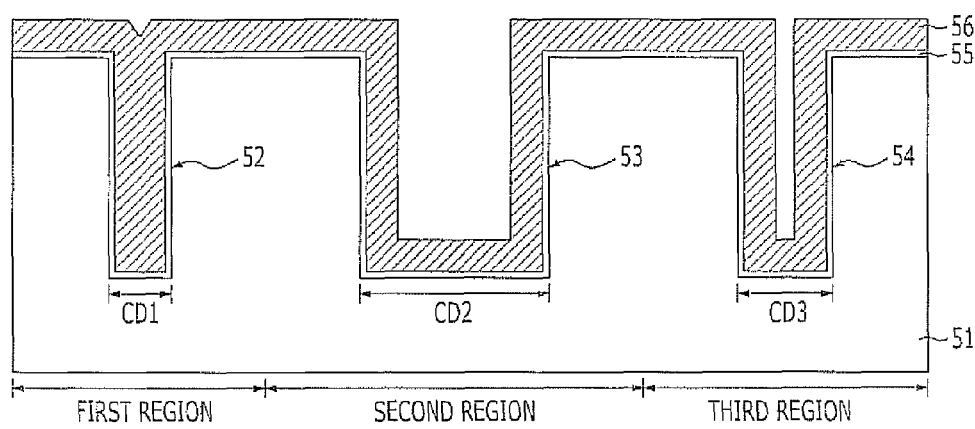

Referring to FIG. 4B, a first insulation layer 55 is formed to have a constant thickness along the surface of the substrate 51 including the first to third trenches 52 to 54. At this time, the thickness of the first insulation layer 55 may be set for an interface layer of an isolation layer formed in the first region. For example, the first insulation layer 55 may be formed to have a thickness of 80 Å or less, for example, a thickness of 1 Å to 80 Å. The first insulation layer 55 serves to restore the surface of the first to third trenches 52 to 54, damaged during the formation process of the first to third trenches 53 to 54, and simultaneously improve an interfacial characteristic between the substrate 51 and a material layer formed on the first insulation layer 55 through a subsequent process. The first insulation layer 55 may be formed of any one selected from the group consisting of oxide, nitride, and oxynitride. For example, the first insulation layer 55 may be formed of oxide formed by thermal oxidation or CVD. At this time, in order to effectively restore the surface of the first to third trenches 53 to 54, the oxide may be formed by thermal oxidation.

A second insulation layer 56 is formed on the first insulation layer 55. At this time, the second insulation layer 56 is formed to have a constant thickness along the surface of the structure including the first insulation layer 55 such that the first trench 52 is gap-filled and the second and third trenches 53 and 54 are not gap-filled. Furthermore, the second insulation layer 56 is formed in a shape to fill the micro-trenches formed at the bottom corners of the second and third trenches 53 and 54.

The second insulation layer 56 may be formed of any one selected from the group consisting of oxide, nitride, and oxynitride. At this time, the second insulation layer 56 may be formed of a material having selectivity with the first insulation layer 55. For example, when the first insulation layer 55 is formed of oxide, the second insulation layer 56 may be formed of nitride.

Figure 4C:
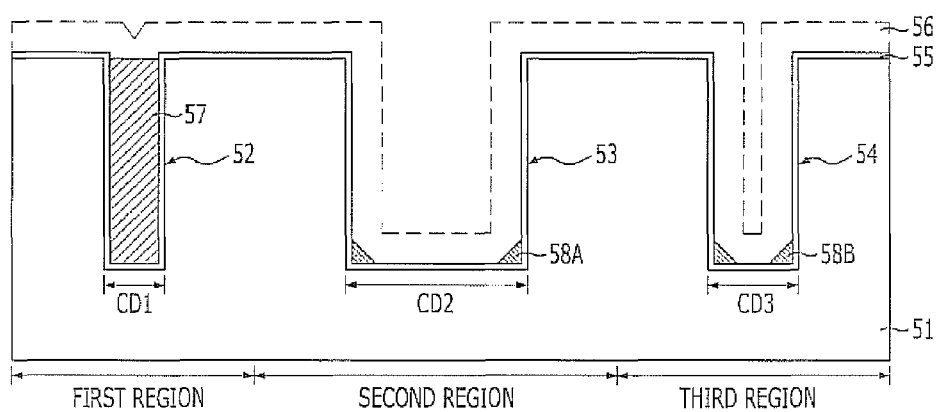

Referring to FIG. 4C, the second insulation layer 56 is selectively etched to form a first gap-fill layer 57 and a buffer layer 58 at the same time. The first gap-fill layer 57 fills the first trench 52 over the first insulation layer 55, and the buffer layer 58 is formed at bottom corners of the second and third trenches 53 and 54. At this time, the buffer layer 58 has a shape to fill the micro-trenches formed at the bottom corners of the second and third trenches 53 and 54.

The etching process for forming the first gap-fill layer 57 and the buffer layer 58 may be performed using a blanket etch process, for example, an etch-back process. At this time, when the second insulation layer 56 is blanket etched, the first gap-fill layer 57 and the buffer layer 58 are formed due to a CD difference among the first to third trenches 52 to 54. Furthermore, when the second insulation layer 56 is blanket etched, the surface damage and loss of the second and third trenches 53 and 54 may be prevented by the first insulation layer 55 formed of a material having selectivity with the second insulation layer 56.

Figure 4D:
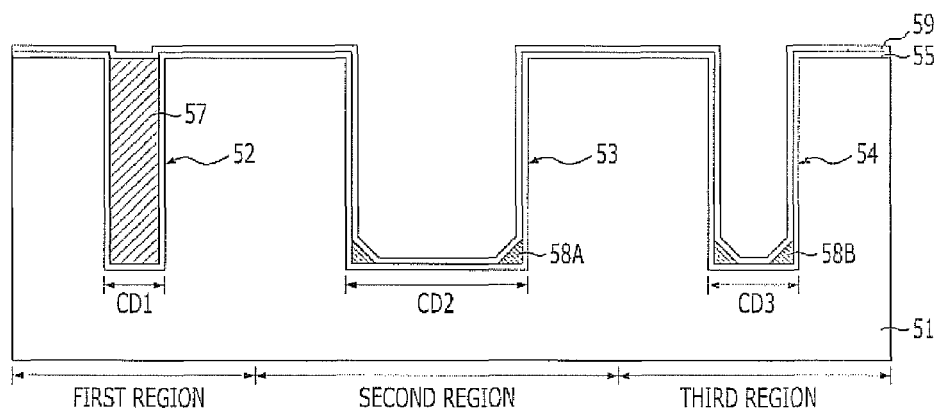

Referring to FIG. 4D, a third insulation layer 59 is formed to have a constant thickness along the surface of the structure including the first gap-fill layer 57 and the buffer layer 58. At this time, the thickness of the third insulation layer 59 may be set for interface layers of isolation layers formed in the second and third regions. That is, the third insulation layer 59 is formed to have such a thickness as to prevent the degradation of HEIP effect. For example, the third insulation layer 59 may have a thickness of 30 Å to 500 Å.

The third insulation layer 59 may be formed of any one selected from the group consisting of oxide, nitride, and oxynitride. The third insulation layer 59 may be formed of the same material as the first insulation layer 55, that is, oxide. The oxide may be formed by thermal oxidation or CVD. At this time, the oxide may be formed by CVD, in order to prevent a reduction in area of an active region defined by the isolation layer formed in the second and third regions during the formation process of the third insulation layer 59.

Through the above-described process, the thickness of the interface layer may be secured for the isolation layer formed in each region.

Figure 4E:
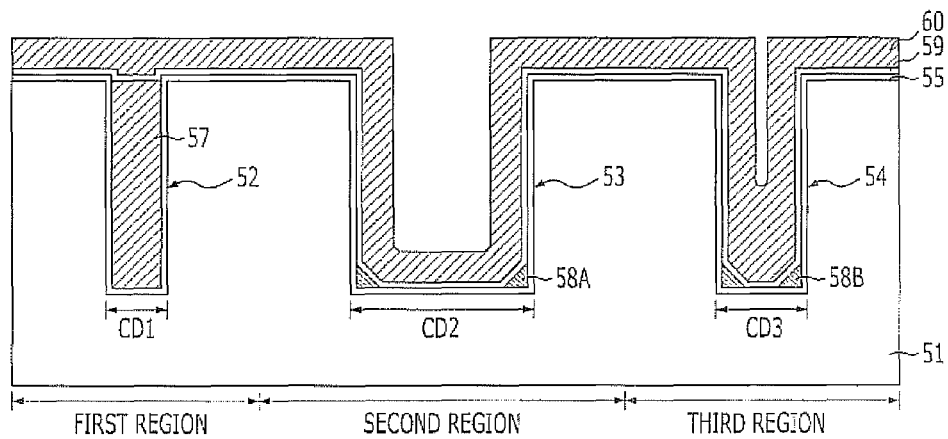

Referring to FIG. 4E, a fourth insulation layer 60 is formed to a have constant thickness along the surface of the structure including the third insulation layer 59. At this time, the fourth insulation layer 60 serves as a liner layer, and it may be formed to have a thickness of 50 Å to 2,000 Å.

The fourth insulation layer 60 formed to have a constant thickness among the surface of the structure may have a different shape in the second and third trenches 53 and 54, because of a CD difference between the second and third trenches 53 and 54. Specifically, in the third trench 54, the fourth insulation layer 60 fills the lower part of the third trench 54 and is formed on the sidewalk of the upper part of the third trench 54. In the second trench 53, however, the fourth insulation layer 60 is formed to have a constant thickness along the surface of the second trench 53.

The fourth insulation layer 60 is formed of any one selected from the group consisting of oxide, nitride, and oxynitride. At this time, the fourth insulation layer 60 serves to relieve stress caused by a fifth insulation layer, which is formed through a subsequent process as a gap-fill layer, and prevent impurities contained in the fifth insulation layer from diffusing into the substrate 51. Accordingly, the fourth insulation layer 60 may be formed of nitride.

Figure 4F:
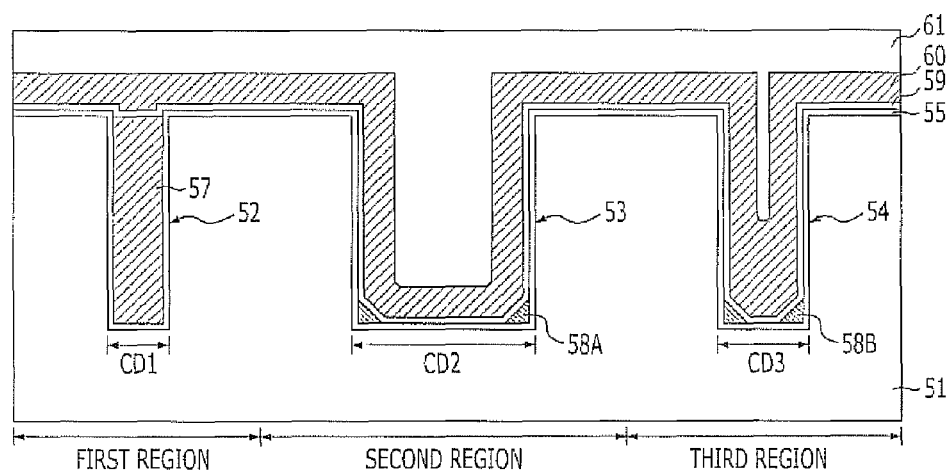

Referring to FIG. 4F, the fifth insulation layer 61 is formed on the fourth insulation layer 60 so as to gap fill the second and third trenches 53 and 54. The fifth insulation layer 61 may be formed of any one selected from the group consisting of oxide, nitride, and oxynitride. The fifth insulation layer 61 may include a spin-on dielectric formed by a spin coating method, in order to secure a gap-fill characteristic in the second and third trenches 53 and 54. For example, when the fifth insulation layer 61 is formed of oxide, a spin-on dielectric based on polysilazane may be used.

Meanwhile, when the fifth insulation layer 61 is formed of a spin-on dielectric, an annealing process is performed after the deposition process, in order to improve a film quality. The volume of the spin-on dielectric may vary during the annealing process, and the fourth insulation layer 60 may relieve stress change caused by the variation in volume of the spin-on dielectric.

Figure 4G:
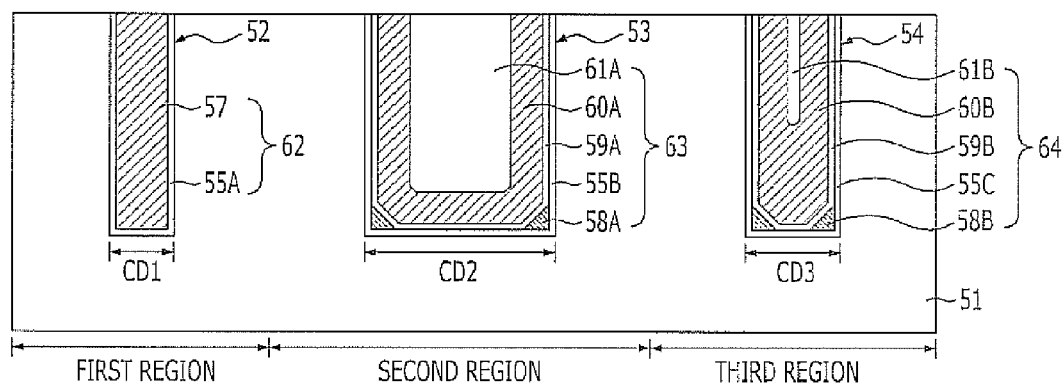

Referring to FIG. 4g, a planarization process is performed until the surface of the substrate 51 is exposed, thereby forming an isolation layer buried in the trench of each region. The planarization process may be performed using chemical mechanical polishing (CMP).

At a time point when the planarization process is completed, a first isolation layer 62 is formed in the first region. The first isolation layer 62 includes the first insulation layer 55A formed on the surface of the first trench 52 and serving as an interface layer and the first gap-fill layer 57 gap-filling the first trench 52 over the first insulation layer 55A. Since the first isolation layer 62 has a simple structure consisting of the first insulation layer 55A and the first gap-fill layer 57, a process margin may be secured during the formation process of the first gap-fill layer 57, even though the CD of the first trench 52 is reduced with the increase in integration degree of the semiconductor device.

At the time point when the planarization process is completed, a second isolation layer 63 is formed in the second region. The second isolation layer 63 includes the first insulation layer 55B and the third insulation layer 59A which are formed on the surface of the second trench 53 and serving as an interface layer, the buffer layer 58 relieving electric field concentration and preventing defects from being caused by the micro-trench, the first liner layer 60A formed on the interface layer, and the second gap-fill layer 61A gap-filling the rest of the second trench 53 over the first liner layer 60A. Furthermore, a third isolation layer 64 is formed in the third region. The third isolation layer 64 includes the first insulation layer 55C and the third insulation layer 59B which are formed on the surface of the third trench 54 and serves as an interface layer, the buffer layer 58 relieving electric field concentration and preventing defects from being caused by the micro-trenches, the second liner layer 60B formed on the interface layer, and the third gap-fill layer 61B gap-filling the rest of the third trench 54 over the second liner layer 60B.

Since the interface layers of the second and third isolation layers 63 and 64 formed through the above-described process have a stacked structure of the first insulation layer and the third insulation layer, the thickness of the interface layer may be easily secured for the semiconductor device. Accordingly, the degradation of HEIP effect may be prevented. Furthermore, as the second and third isolation layers 63 and 64 include the buffer layer 58 formed at the bottom corners of the second and third trenches 53 and 54, electric field concentration may be relieved and simultaneously the defect and characteristic degradation may be prevented from being caused by the micro-trenches.

So far, the case that the semiconductor device with an isolation layer buried in a trench in accordance with the embodiment of the present invention is applied to a memory device such as DRAM has been described. This is only an example for describing the features of the present invention, and the isolation layer in accordance with the embodiment of the present invention may be applied to various electronic devices. Electronic devices to which the isolation layer in accordance with the embodiment of the present invention may be applied include a graphics memory, a mobile device, a portable storage medium, a digital application (for example, MP3P, PMP, digital camera, camcorder, mobile phone or the like), a CMOS image sensor (CIS) and the like.

An electronic device with an isolation layer in accordance with another embodiment of the present invention may have a structure in which unit components are isolated by an isolation layer (refer to FIG. 2A) including a trench formed in a substrate, a buffer layer formed at a bottom corner of the trench, an interface layer formed on the surface of the trench and including the buffer layer therein, a liner layer formed on the interface layer, and a gap-fill layer gap-filling the trench over the liner layer.

Furthermore, a modified example of the electronic device with an isolation layer in accordance with the embodiment of the present invention may include an electronic device having a structure in which unit components are isolated by isolation layers buried in a first trench and a second trench having a CD greater than the first trench. The isolation layers may include a first isolation layer (refer to FIG. 2A) and a second isolation layer (refer to FIG. 2A). The first isolation layer includes a first interface layer formed on the surface of the first trench and a first gap-fill layer formed on the first interface layer and gap-filling the first trench, and the second isolation layer includes a buffer layer formed at a bottom corner of the second trench, a second interface layer formed on the surface of the second trench and including the buffer layer therein, a liner layer formed on the second interface layer, and a second gap-fill layer gap-filling the second trench over the liner layer.

The unit components of the electronic device may include active elements including transistors and passive elements including capacitors, resistors and the like.

Hereinafter, a memory chip (refer to FIG. 5), a memory module with memory chips (refer to FIG. 6), and a memory system with memory modules (refer to FIG. 7) will be briefly described as examples of the electronic device with an isolation layer in accordance with the embodiment of the present invention.

Figure 5:
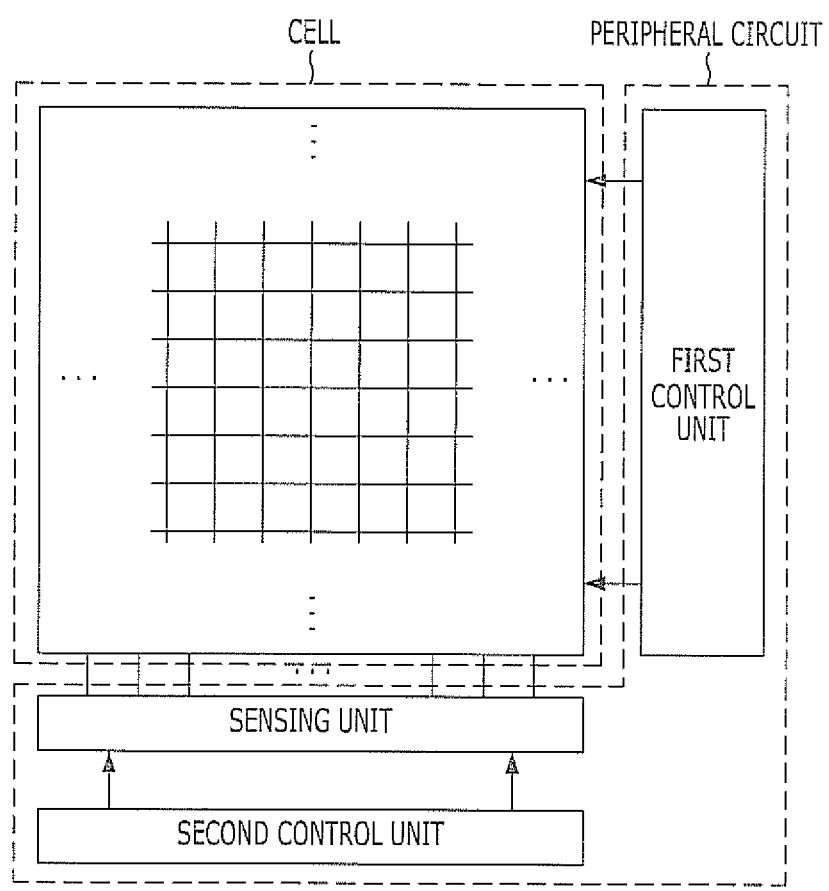
FIG. 5 is a block diagram illustrating a memory chip with isolation layers buried in trenches in accordance with another exemplary embodiment of the present invention.

FIG. 5 is a block diagram illustrating a memory chip with isolation layers buried in trenches in accordance with another embodiment of the present invention.

Referring to FIG. 5, the memory chip includes a cell region and a peripheral circuit region. The cell region includes a plurality of unit memory cells isolated by isolation layers (refer to FIG. 2A) buried in trenches, and the peripheral circuit region includes a first control unit, a second control unit, and a sensing unit, each of which includes a plurality of transistors isolated by isolation layers (refer to FIGS. 2A and 2C) buried in trenches. In the peripheral circuit region, the first control unit may serve as a row decoder, the second control unit may serve as a column decoder, and the sensing unit may serve as a sense amplifier.

The first control unit is configured to select a word line corresponding to a memory cell to perform a read or write operation, among a plurality of word lines formed in the cell region, and output a select signal to the cell region. The second control unit is configured to select a bit line corresponding to a memory cell to perform a read or write operation, among a plurality of bit lines formed in the cell region, and output a select signal to the cell region. Furthermore, the sensing unit is configured to sense information stored in the memory cell selected by the first and second control units.

Here, as the memory chip provides an interface layer having a thickness for each of the regions, i.e., the cell region and the peripheral circuit region, a process margin may be secured during the formation process of the isolation layer and simultaneously the degradation of HEIP effect may be prevented. Furthermore, as the memory chip provides a buffer layer, electrical field concentration occurring at the bottom corners of a trench may be relieved, thereby improving the deposition characteristic of a liner layer and the gap-fill characteristic of a gap-fill layer. Furthermore, as the buffer layer has a shape to fill a micro-trench formed at the bottom corner of the trench, the defect and characteristic degradation may be prevented from being caused by the micro-trench.

Figure 6:
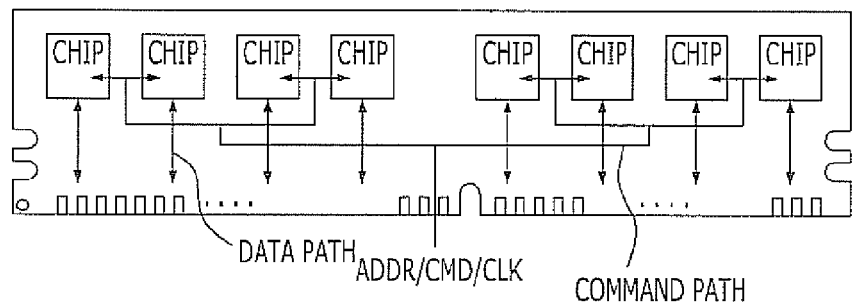
FIG. 6 is a block diagram illustrating a memory module with isolation layers buried in trenches in accordance with another exemplary embodiment of the present invention.

FIG. 6 is a block diagram illustrating a memory module with isolation layers buried in trenches in accordance with another embodiment of the present invention.

Referring to FIG. 6, the memory module includes a plurality of memory chips mounted on a module substrate, a command path through which the memory chips receive a control signal (address signal ADDR, command signal CMD, or clock signal CLK) from an external controller (not illustrated), and a data path connected to the memory chips and configured to transmit data. Furthermore, the command path and the data path may be formed in the same manner as or a similar manner to those used in a conventional memory module.

FIG. 6 illustrates eight memory chips mounted on the front surface of the module substrate, but the same number of memory chips may be mounted on the rear surface of the module substrate. That is, the memory chips may be mounted on one side or both sides of the module substrate, and the number of memory chips to be mounted is not limited to the memory module of FIG. 6. Furthermore, the material and structure of the module substrate are not limited specifically.

Each of the isolation layers buried in trenches in accordance with the embodiment of the present invention, which is formed inside the memory chips of the memory module, provides an interface layer having a thickness for each of the regions, i.e., the cell region and the peripheral circuit region. Therefore, a process margin may be secured during the formation process of the isolation layer and simultaneously the degradation of HEIP effect may be prevented. Furthermore, as the isolation layer provides a buffer layer, electrical field concentration occurring at the bottom corners of the trench may be relieved, thereby improving the deposition characteristic of a liner layer and the gap-fill characteristic of a gap-fill layer. Furthermore, as the buffer layer has a shape to fill a micro-trench formed at the bottom corners of the trench, the defect and characteristic degradation may be prevented from being caused by the micro-trench.

Figure 7:
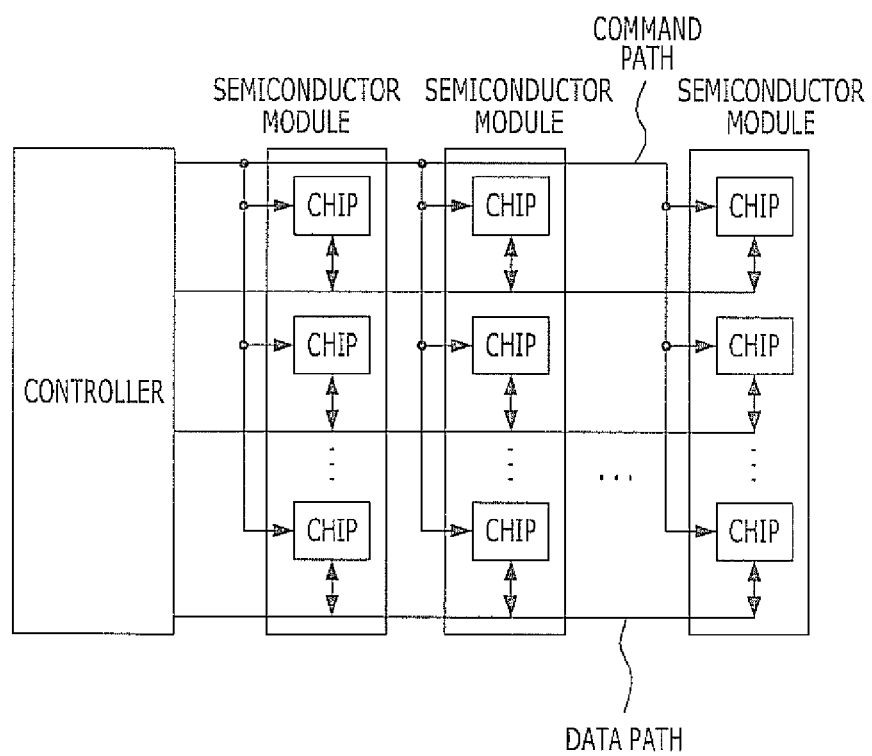
FIG. 7 is a block diagram illustrating a memory system with isolation layers buried in trenches in accordance with another exemplary embodiment of the present invention.

FIG. 7 is a block diagram illustrating a memory system with isolation layers buried in trenches in accordance with another embodiment of the present invention.

Referring to FIG. 7, the memory system includes a plurality of memory modules each including one or more memory chips. Furthermore, the memory system includes a memory controller configured to communicate data and command/address signals with the memory modules through a system bus.

Each of the isolation layers buried in trenches in accordance with the embodiment of the present invention, which is formed inside the memory chips of the memory system, provides an interface layer having a thickness for each of the regions, i.e., the cell region and the peripheral circuit region. Therefore, a process margin may be secured during the formation process of the isolation layers and simultaneously the degradation of HEIP effect may be prevented. Furthermore, as the isolation layer provides a buffer layer, electrical field concentration occurring at the bottom corners of the trench may be relieved, thereby improving the deposition characteristic of a liner layer and the gap-fill characteristic of a gap-fill layer. Furthermore, as the buffer layer has a shape to fill a micro-trench formed at, the bottom corner of the trench, the defect and characteristic degradation may be prevented from being caused by the micro-trench.

In accordance with the embodiments of the present invention, since the isolation layer buried in the trench has a simple structure consisting of the interface layer and the gap-fill layer, a margin for the gap-fill layer formation process may be secured, even though the CD of the trench is reduced with the increase in integration degree of the semiconductor device.

Furthermore, as the interface layers having different thicknesses (or CDs) are provided in the respective regions, a process margin may be secured during the formation process of the isolation layer while preventing the degradation of HEIP effect.

Furthermore, as the buffer layer is provided, electric field concentration occurring at the bottom corner of the trench may be relieved, thereby improving the deposition characteristic of the liner layer and the gap-fill characteristic of the gap-fill layer.

Furthermore, since the buffer layer has a shape to fill the micro-trench formed at the bottom corner of the trench, the defect and characteristic degradation may be prevented from being caused by the micro-trench.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a trench in a substrate;
    forming a first insulation layer on the surface of the trench;
    forming a buffer layer over the first insulation layer at a bottom corner of the trench;
    forming a third insulation layer along the surface of the resultant structure including the buffer layer;
    forming a liner layer over the third insulation layer; and
    forming a gap-fill layer to gap-fill the trench over the liner layer.

2. The method of claim 1, wherein the forming of the buffer layer comprises:
    forming a second insulation layer along the surface of the resultant structure including the first insulation layer; and
    blanket etching the second insulation layer.

3. The method of claim 1, wherein the first and third insulation layers comprise oxide, the buffer layer comprise nitride, and the gap-fill layer comprises a spin-on dielectric.

4. The method of claim 1, wherein the trench comprises a micro-trench formed at the bottom corner thereof, and
    the buffer layer fills the micro-trench.

5. A method for fabricating a semiconductor device, comprising:
    forming a first trench and a second trench in a substrate, the second trench having a critical dimension (CD) greater than the first trench;
    forming a first insulation layer on the surface of the substrate including the first and second trenches;
    forming a second insulation layer on the surface of the substrate including the first insulation layer, the second insulation layer gap-filling the first trench and formed along the surface of the second trench;
    selectively etching the second insulation layer to form a first gap-fill layer gap-filling the first trench and a buffer layer at a bottom corner of the second trench;
    sequentially forming a third insulation layer and a liner layer on the surface of the substrate including the buffer layer; and
    forming a second gap-fill layer to gap-fill the second trench over the liner layer.

6. The method of claim 5, wherein the etching of the second insulation layer comprises blanket etching the second insulation layer.

7. The method of claim 5, wherein the first and third insulation layers comprise oxide, the second insulation layer comprises nitride, and the second gap-fill layer comprises a spin-on dielectric.

8. The method of claim 5, wherein the second trench comprises a micro-trench formed at the bottom corner thereof, and the buffer layer fills the micro-trench.

* * * * *